US007098436B2

(12) United States Patent
Bacarella et al.

(10) Patent No.: US 7,098,436 B2
(45) **Date of Patent: *Aug. 29, 2006**

(54) METHOD AND SYSTEM FOR GENERATING AN IMAGE HAVING MULTIPLE HUES

(75) Inventors: Antonio V. Bacarella, Dallas, TX (US); Timothy E. Ostromek, Richardson, TX (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/068,257

(22) Filed: Feb. 28, 2005

(65) Prior Publication Data

US 2005/0145778 A1 Jul. 7, 2005

Related U.S. Application Data

(63) Continuation of application No. 10/224,924, filed on Aug. 20, 2002, now Pat. No. 6,861,638.

(51) Int. Cl.
*H01L 27/00* (2006.01)

(52) U.S. Cl. .................................... 250/208.1; 250/226

(58) Field of Classification Search ............. 250/208.1, 250/226
See application file for complete search history.

(56) References Cited

U.S. PATENT DOCUMENTS

| | | | | |
|---|---|---|---|---|
| 2,713,083 | A | 7/1955 | Tomer | |
| 3,231,746 | A | 1/1966 | Goodrich | |
| 4,724,354 | A | 2/1988 | Dill | |
| 5,162,647 | A | 11/1992 | Field, Jr. | |
| 5,233,183 | A | 8/1993 | Field | |
| 5,241,170 | A * | 8/1993 | Field et al. | 250/214 VT |
| 5,742,115 | A | 4/1998 | Gertsenshteyn | |
| 5,756,989 | A | 5/1998 | Bear et al. | |
| 6,861,638 | B1 * | 3/2005 | Bacarella et al. | 250/214 VT |

FOREIGN PATENT DOCUMENTS

| | | |
|---|---|---|
| JP | 04373388 | 12/1992 |

OTHER PUBLICATIONS

PCT, Notification ot Transmittal of the International Search Report or the Declaration, International Application No. PCT/US03/25316, 7 pages.

* cited by examiner

*Primary Examiner*—Que T. Le
(74) *Attorney, Agent, or Firm*—Fulbright & Jaworski, LLP

(57) ABSTRACT

A technique for generating an image having multiple hues includes filtering first photons at a first wavelength range using a first input filter section of an input filter, and filtering second photons at a second wavelength range using a second input filter section of the input filter. The first photons are directed towards a tube pixel set of a sensor, and the second photons are directed towards the tube pixel set. The first photons and the second photons are detected at the sensor. The first photons are received using a first output filter section of an output filter, and the second photons are received using a second output filter section of the output filter. An image is generated from the first photons and the second photons.

21 Claims, 3 Drawing Sheets

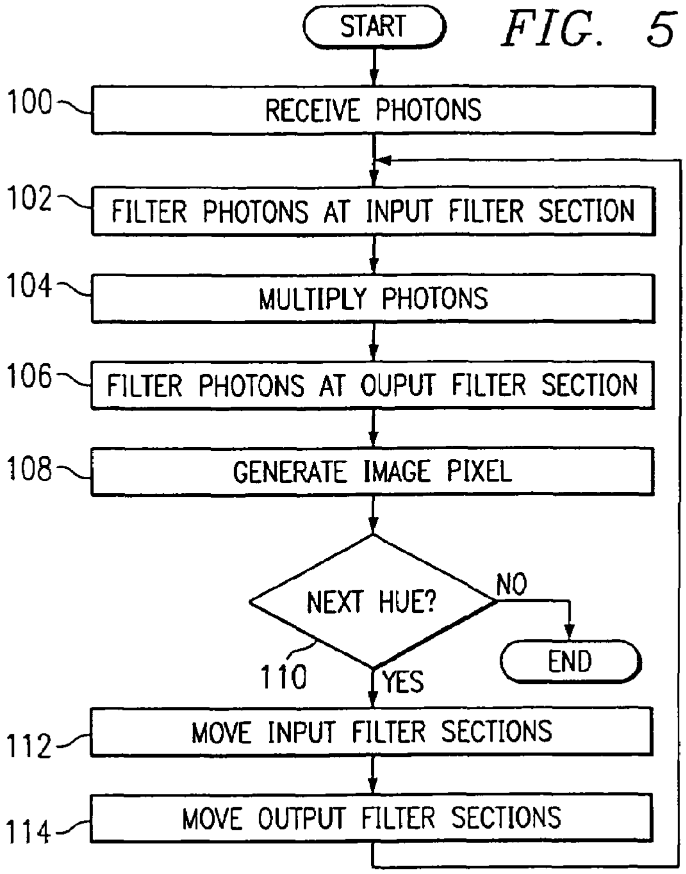
*FIG. 5*
*FIG. 3*
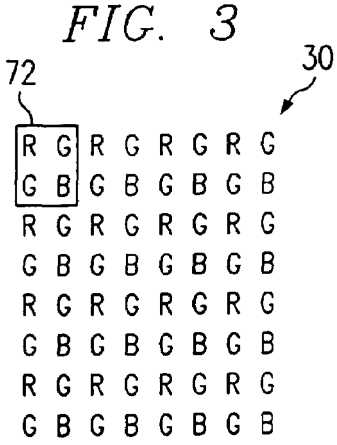
*FIG. 4A*
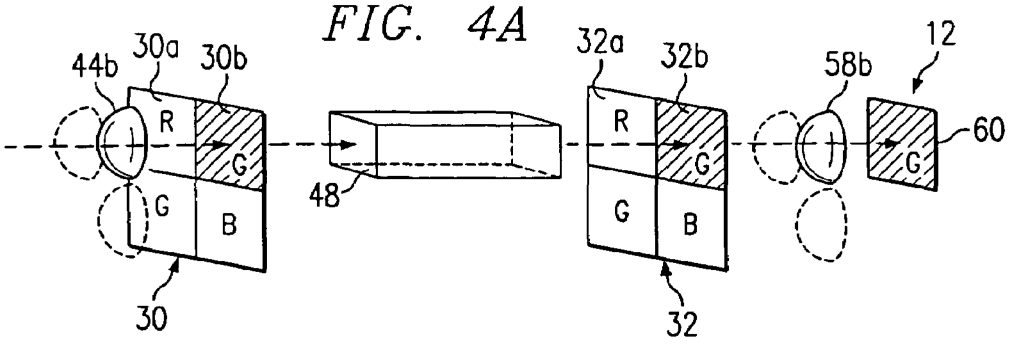
*FIG. 4B*
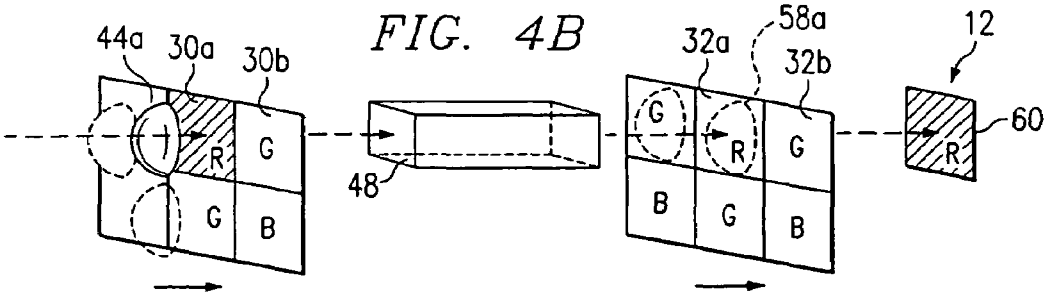

METHOD AND SYSTEM FOR GENERATING AN IMAGE HAVING MULTIPLE HUES

RELATED APPLICATIONS

This application is a continuation of application Ser. No. 10/224,924, filed Aug. 20, 2002, and issued as U.S. Pat. No. 6,861,638 on Mar. 1, 2005.

TECHNICAL FIELD OF THE INVENTION

This invention relates generally to the field of optical systems and more specifically to a method and system for generating an image having multiple hues.

BACKGROUND OF THE INVENTION

Image intensifier devices may be used in night vision devices in order to enhance a low light image. Image intensifier devices typically use a spinning disk filter or multiple image intensifier tubes to generate a color image. These devices, however, are generally bulky and heavy. Consequently, typical image intensifier devices are unsatisfactory for many needs.

SUMMARY OF THE INVENTION

In accordance with the present invention, a method and system for generating an image having multiple hues are provided that may eliminate or reduce the disadvantages and problems associated with previously developed systems and methods.

According to one embodiment, generating an image having multiple hues includes filtering first photons at a first wavelength range using a first input filter section of an input filter, and filtering second photons at a second wavelength range using a second input filter section of the input filter. The first photons are directed towards a tube pixel set of a sensor, and the second photons are directed towards the tube pixel set. The first photons and the second photons are detected at the sensor. The first photons are received using a first output filter section of an output filter, and the second photons are received using a second output filter section of the output filter. An image is generated from the first photons and the second photons.

Embodiments of the invention may provide technical advantages. A technical advantage of one embodiment is that an image having at least two colors may be generated. The embodiment includes an input filter and an output filter that have different filter sections that respond to different wavelengths. An image intensifier multiplies photons received from the input filter sections, and transmits the multiplied photons to the output filter sections. The photons received at the output filter sections are used to generate an image having at least two colors.

Another technical advantage of one embodiment is that displacement devices may be used to move the input filter and the output filter such that photons filtered by an input filter section that filters for a wavelength range are received at an output filter section that also filters photons at that wavelength range. The displacement devices may move the input filter sections and the output filter sections with sufficient speed such that the human eye cannot detect the movement.

Another technical advantage of one embodiment is that an input lens may include input lens sections that direct photons from the input filter sections onto a pixel set of the image intensifier. For example, an input lens section may direct photons through an input filter section corresponding to a red color to a pixel set, and another input lens section may direct photons through an input filter section corresponding to a blue color to the pixel set. A layer between the input filter and a photocathode of the image intensifier may be used to protect the photocathode from contamination.

Other technical advantages are readily apparent to one skilled in the art from the following figures, descriptions, and claims. Embodiments of the invention may provide none, some, or all of the technical advantages.

BRIEF DESCRIPTION OF THE DRAWINGS

For a more complete understanding of the present invention and for further features and advantages, reference is now made to the following description, taken in conjunction with the accompanying drawings, in which:

FIG. 3 illustrates one embodiment of input filter sections configured in a Bayer pattern;

FIGS. 4A and 4B illustrate an input filter and an output filter of the system of FIG. 2;

FIG. 5 is a flowchart illustrating a method for generating an image having multiple hues.

DETAILED DESCRIPTION OF THE DRAWINGS

Embodiments of the present invention and its advantages are best understood by referring to FIGS. 1 through 4 of the drawings, like numerals being used for like and corresponding parts of the various drawings.

Figure 1:
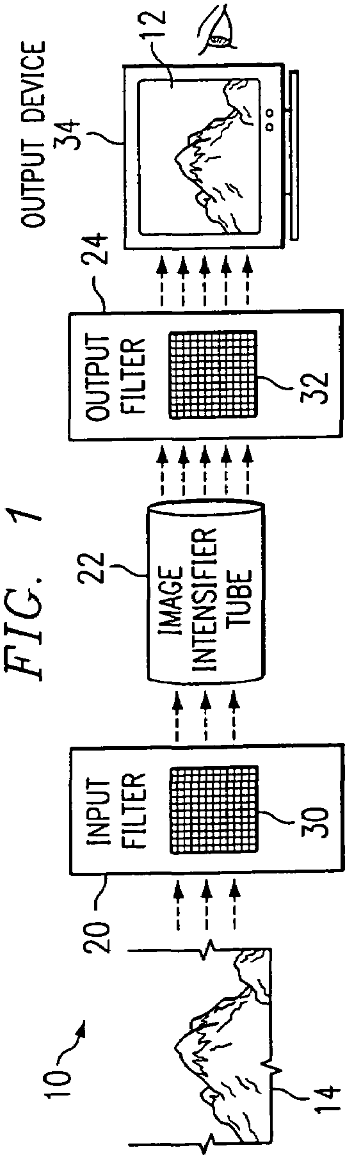
FIG. 1 is a block diagram of one embodiment of a system for generating an image having multiple hues.

FIG. 1 is a block diagram illustrating a system 10 for generating an intensified image 12 of an object 14. An intensified image of a scene is an image in which the visible or other light or energy from the scene is intensified, increased, or otherwise enhanced. System 10 includes an input filter 20, an image intensifier 22, and an output filter 24. Input filter 20 receives photons, or energy, reflected from object 14. The photons include image information about object 14 that may be used to generate the intensified image 12 of object 14.

Input filter 20 includes a number of input filter sections 30. Each input filter section 30 filters photons at a specific wavelength range, which may be a narrow range, single wavelength, or otherwise suitable wavelength range, and different input filter sections 30 may filter photons at different wavelength ranges. "Each" as used in this document refers to each member of a set or each member of a subset of a set.

Wavelength ranges correspond to specific hues, which are perceived as color. For example, photons at or around a wavelength of 630 to 750 nanometers have a red hue, photons at or around a wavelength of 450 to 490 nanometers have a blue hue, and photons at or around a wavelength of 490 to 570 nanometers have a green hue. Additionally, photons at or around a wavelength of 750 nanometers to 1 millimeter have an infrared hue. Accordingly, each input filter section 30 filters photons having a specific hue, which is an attribute of the photons that describes the wavelength of photons.

A sensor such as image intensifier 22 receives the filtered photons from input filter 20. Image intensifier 22 may comprise an image intensifier tube, or other suitable device capable of enhancing received energy from a scene for generation of an intensified image. Image intensifier 22 may multiply the photons in order to intensify a resulting image 12 generated from the photons. Image 12 of an object 14 in a low light area may be improved by image intensification. Although the sensor of system 10 comprises image intensifier 22, the sensor may comprise any sensor suitable for detecting an image such as a monochromatic image sensor.

Output filter 24 receives the multiplied photons from image intensifier 22. Output filter 24 includes output filter sections 32. Each output filter section 32 filters photons at a specific wavelength range. Output filter sections 32 may be aligned with input filter sections 30 such that photons filtered by an input filter section 30 that filters for a wavelength range are received at an output filter section 32 that filters photons at that wavelength range. Input filter 20 and output filter 24 may filter photons having a number of hues. Accordingly, system 10 may provide for generating image 12 having multiple hues, which may be perceived as a multiple color image.

An output device 34 receives the filtered photons from output filter 24 and generates image 12 from the received photons. Output device 34 may comprise, for example, a database, a monitor, a printer, a lens, or any other device operable to store or to display intensified image 12 of object 14.

Figure 2:
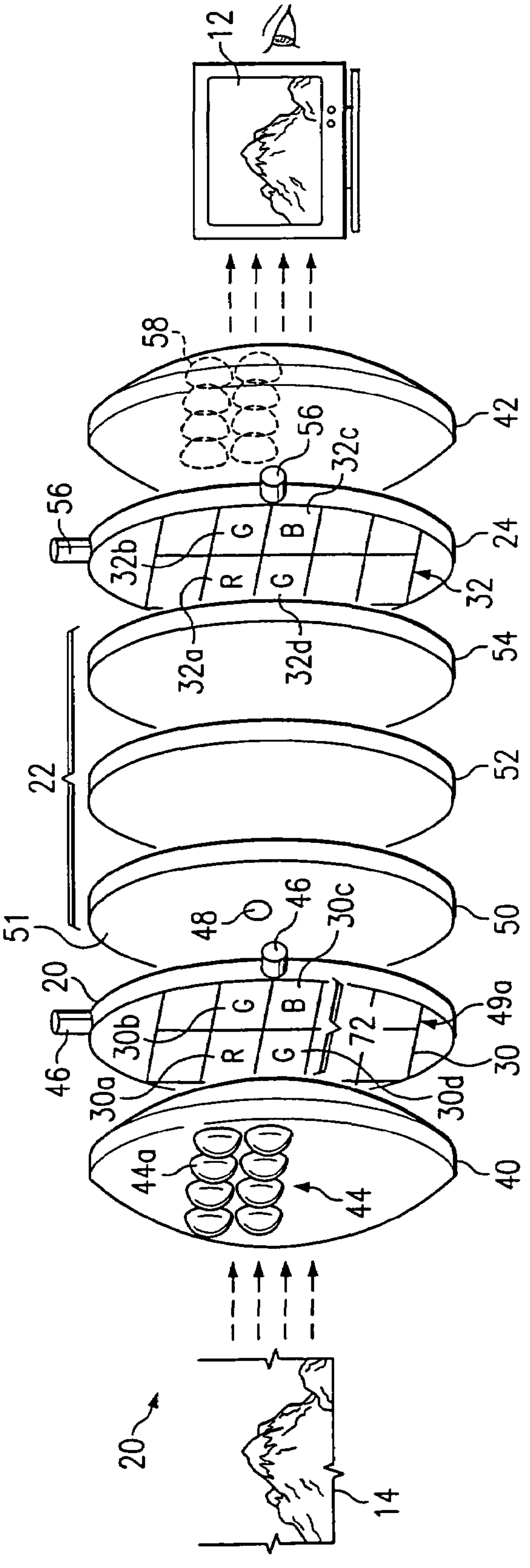
FIG. 2 illustrates one embodiment of a system for generating an image having multiple hues.

FIG. 2 illustrates one embodiment of a system 20 for generating image 12 of object 14. System 20 includes an input lens 40, input filter 20, image intensifier 22, output filter 24, and an output lens 42. Input lens 40 directs photons reflected from object 14 through input filter 20 to image intensifier 22. Input lens 40 may comprise an objective lens having any shape and comprising any material such as glass suitable for directing photons on image intensifier 22. Input lens 40 may include input lens sections 44 that each direct photons through input filter sections 30 to a pixel or pixel set of image intensifier 22. For example, input lens section 44*a* may direct photons through input filter section 30*a* to a pixel set of image intensifier 22. An input lens section 44 may have any shape suitable for directing photons to image intensifier 22.

Input filter 20 may comprise a sensing array, where each input filter section 30 comprises a luminance- and chrominance-sensitive element. Input filter 20 may comprise input filter sections 44 that generate a multiple color image. The individual input filter sections 44 are designed to not be visible to a viewer. In the illustrated example, a set 72 includes input filter sections 30*a–d*. Input filter section 30*a* corresponds to a red (R) hue, input filter sections 30*b* and *d* correspond to a green (G) hue, and input filter section 30*c* corresponds to a blue (B) hue. Input filter 20 may comprise, for example, a Bayer filter having input filter sections 30 arranged in a Bayer pattern.

FIG. 3 illustrates one embodiment of input filter sections 30 arranged in a Bayer pattern. Input filter sections 30 comprise an arrangement of red, green, and blue sections. Rows of red and green sections alternate with rows of green and blue sections. Set 72 comprising a row of red and green sections and a row of green and blue sections is typically used to generate a pixel or pixel set of image 12 having multiple hues.

Referring back to FIG. 2, set 72 of input filter sections 30 may be aligned with image intensifier 22 such that photons filtered by set 72 of input filter sections 30 are simultaneously transmitted to a tube pixel set 48 of image intensifier. Alternatively, set 70 of input filter sections 30 may be moved such that each input filter section 30 directs photons onto tube pixel set 48 at different times. For example, input filter section 30*a* corresponding to red directs photons onto tube pixel set 48, then input filter section 30*b* corresponding to green directs photons onto tube pixel set 48, then input filter section 30*c* corresponding to blue directs photons onto tube pixel set 48, then input filter section 30*d* corresponding to green directs photons onto tube pixel set 48. If input filter sections 30*a–d* are sufficiently spaced and move sufficiently fast, the human eye cannot detect the movement and the resulting image 12 may be perceived as having multiple colors. For example, input filter sections may move approximately 60 frames per second, where one frame comprises directing photons from each input filter section 30*a–d* of set 72 on tube pixel set 48.

In one embodiment, input filter 20 may also include optional displacement devices 46 that move input filter sections 30 to direct light filtered by input filter sections 30 to tube pixel set 48 in order to change the wavelength of light directed to tube pixel set 48. Displacement device 46 may include a displacement device 46 that moves input filter 20 in an x-direction and a displacement device 46 that moves input filter 20 in a y-direction. Displacement devices 46 may work together to move input filter 20 in a smooth motion. Displacement devices 46 may comprise, for example, Piezo electric transducers.

Image intensifier 22 includes a photocathode 50, a microchannel plate 52, and a phosphor screen 54. Photocathode 50 converts photons received from input filter 20 into electrons, and may comprise, for example, gallium arsenide. A layer 51 may be disposed outwardly from photocathode 50. Layer 51 may comprise a translucent material such as frosted glass, which may protect photocathode 50 from contamination. Microchannel plate 52 multiplies electrons received from photocathode 50. Microchannel plate 52 may comprise a transparent material such as glass with any number of microscopic microchannels that function as electron multipliers that multiply electrons using a cascaded secondary emission process.

Phosphor screen 54 converts the multiplied electrons received from microchannel plate 52 to photons. Phosphor screen 54 may comprise a screen having a coating of a white phosphor such as $P_{45}$ that transmits a photon in response to receiving an electron. Image intensifier 22 may operate under a vacuum of, for example, $10^{-9}$ torr, or any other vacuum suitable for the operation of image intensifier 22

Output filter 24 may be substantially similar to input filter 22. Output filter 24 may include output filter sections 32 that filter for photons at specific wavelength ranges. In the illustrated example, set 72 comprises output filter sections 32*a–d*. Output filter section 32*a* filters photons having a red hue, output filter sections 32*b* and 32*d* filter photons having a green hue, and output filter section 32*c* filters photons having a blue hue. Output filter sections 32 may be aligned with input filter sections 30 such that photons that are filtered by an input filter section 30 at a specific wavelength range are received at an output filter section 32 that filters at that specific wavelength range. For example, output filter section 32*a* that filters photons having a red hue may be aligned to receive photons filtered by input filter section 30*a* that filters photons also having a red hue.

Output filter 24 may also include displacement devices 56 that may be used to align output filter section 32 with the corresponding input filter sections 30. Displacement devices 56 may be substantially similar to displacement devices 46.

Output device 34 may comprise output lens 42, which magnifies and focuses photons received from output filter 24 in order to generate image 12. Output lens 42 may comprise output lens sections 58, and may be substantially similar to input lens 40.

Output filter 24 and input filter 20 may have differences. For example, output filter 24 may have features to correct for the spectral characteristics of phosphor screen 54. Output filter 24 may include tint control features that are absent in input filter 20.

FIGS. 4A and 4B illustrate movement of input filter sections 30 and output filter sections 32 to generate an image pixel set 60 having multiple hues. FIG. 4A illustrates input filter sections 30 and output filter sections 32 at a first position that yields an image pixel set 60 having a green hue. Input lens section 44*b* directs photons through input filter section 30*b* that filters photons having a green hue onto tube pixel set 48. Tube pixel set 48 receives the green filtered photons, and image intensifier 22 multiplies the photons. Output filter section 32*b* that filters for photons having a green hue receives the multiplied photons. Output lens section 58*b* directs the photons from tube pixel set 48 through output filter section 32*b* to generate image pixel set 60 having a green hue.

FIG. 4B illustrates input filter sections 30 and output filter sections 32 at a second position to generate image pixel set 60 having a red hue. Input lens section 44*a* directs photons through input filter section 30*a* that filters photons having a red hue onto tube pixel set 48. Tube pixel set 48 receives the red filtered photons, and image intensifier 22 multiplies the photons. Output filter section 32*a* that filters for photons having a red hue receives the multiplied photons. Output lens section 58*a* directs photons from tube pixel set 48 through output filter section 32*a* to generate image pixel set 60 having a red hue.

In the illustrated example, input filter sections 30 and output filter sections 32 move with respect to tube pixel set 48 and image pixel set 60 in order to first direct green-filtered photons on image pixel set 60 and then direct red-filtered photons on image pixel set 60. Any suitable change in relative position between input filter sections 30, pixel set 48, output filter sections 32, and image pixel set 60 may be used in order to change the hue of image pixel set 60. For example, tube pixel set 48 and image pixel set 60 may move with respect to input filter sections 30 and output filter sections 32 in order to change the hue of image pixel set 60.

FIG. 5 is a flowchart illustrating a method for generating an image having multiple hues. The method begins at step 100, where system 20 receives photons reflected from or generated by object 14. Input filter sections 30 and output filter sections 32 are at the first position as illustrated in FIG. 4A. Input lens section 44*b* directs photons through input filter section 30*b* to tube pixel set 48. At step 204, photons having a green hue are filtered at input filter section 30*b*. Filtered photons are multiplied at step 104. At step 106, the multiplied photons are filtered at output filter section 32*b* that corresponds to green. Image pixel set 60 having a green hue is generated at step 108.

At step 110, the method determines whether there is a next hue. If there is a next hue, the method proceeds to step 112 to move input filter sections 30 to a second position, as illustrated in FIG. 4B. Output filter sections 32 are moved to be aligned with input filter sections 30 at step 114. The method then returns to step 102 to filter photons having a red hue at input filter section 30*a*. The filtered photons are multiplied at step 104, and the multiplied photons are filtered at output filter section 32*a* that correspond to red at step 106. Image pixel set 60 having red hue is generated at step 108. If there is no next hue at step 110, the method terminates.

Figure 6A:
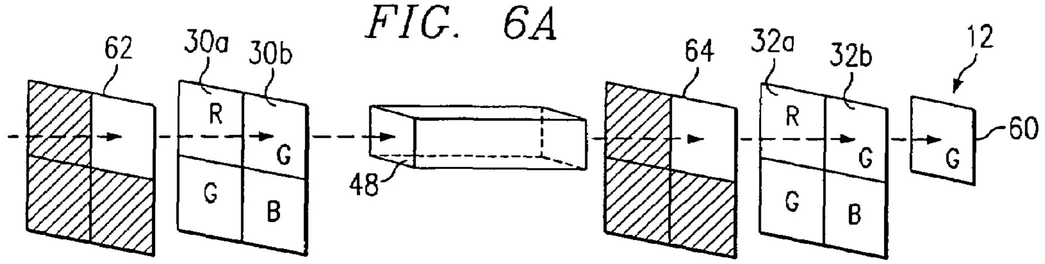
FIGS. 6A and 6B illustrate the movement of an input obscurant and an output obscurant to generate an image pixel set having multiple hues.
Figure 6B:
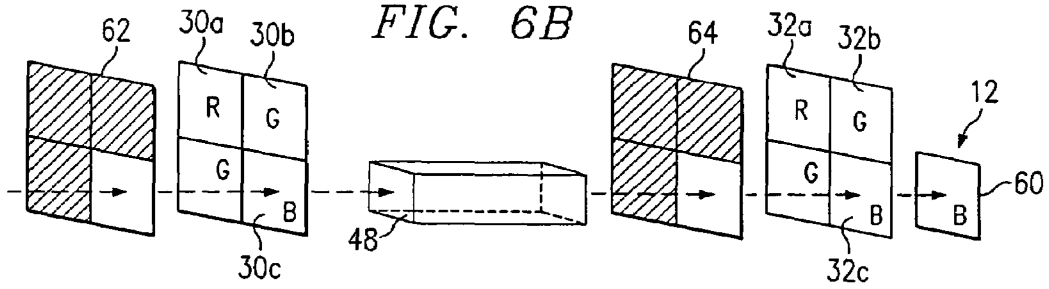

FIGS. 6A and 6B illustrate the movement of an input obscurant 62 and an output obscurant 64 to generate an image pixel set 60 having multiple hues. FIG. 6A illustrates input obscurant 62 and output obscurant 64 at a first position that yields an image pixel set 60 having a green hue. Input obscurant 62 directs photons towards input filter section 30*b* that filters photons having a green hue. Input obscurant 62 and output obscurant 64 may direct photons by allowing some photons to pass through an opening and blocking other photons. Tube pixel set 48 receives the green filtered photons, and image intensifier 22 multiplies the photons. Output obscurant 64 directs the photons from tube pixel set 48 through output filter section 32*b* that filters for photons having a green hue. The filtered photons generate image pixel set 60 having a green hue.

FIG. 6B illustrates input obscurant 62 and output obscurant 64 at a second position to generate image pixel set 60 having a blue hue. Input obscurant 62 directs photons through input filter section 30*c* that filters for photons having a blue hue. Tube pixel set 48 receives the blue filtered photons, and image intensifier 22 multiplies the photons. Output obscurant 64 directs photons towards output filter section 32*c* that filters for photons having a blue hue. The filtered photons generate image pixel 60 having a blue hue.

In the illustrated example, input obscurant 62 and output obscurant 64 move with respect to tube pixel set 48 in order to first direct green-filtered photons on image pixel set 60 and then direct blue-filtered photons on image pixel set 60. Any suitable change in the relative positions between input obscurant 62, input filter section 30, tube pixel set 48, output obscurant 64, and output filter sections 32 may be used to change the hue of image pixel set 60. For example, input filter sections 30 and output filter sections 32 may move with respect to tube pixel set 48 and image pixel set 60 in order to change the hue of image pixel set 60.

Embodiments of the invention may provide technical advantages. A technical advantage of one embodiment is that image 12 having at least two colors may be generated. Input filter 20 and output filter 24 have different filter sections 30 and 32 that respond to different wavelengths. Image intensifier 22 multiplies photons received from input filter sections 30, and transmits the multiplied photons to output filter sections 32. The photons received at the output filter sections 32 are used to generate image 12 having at least two colors.

Another technical advantage of one embodiment is that displacement devices 46 and 56 may be used to move input filter 20 and output filter 24 such that photons filtered by input filter section 30 that filters for a wavelength range are received at output filter section 32 that also filters photons at that wavelength range. Displacement devices 46 and 56 may move input filter sections 30 and output filter sections 32 with sufficient speed such that the human eye cannot detect the movement.

Another technical advantage of one embodiment is that input lens 40 may include input lens sections 44 that direct photons through input filter sections 30 onto pixel set 48 of image intensifier 22. For example, an input lens section 44 may direct photons through an input filter section 30 corresponding to a red color to pixel set 48, and another input lens section 44 may direct photons through an input filter section 30 corresponding to a blue color to pixel set 48. Layer 51 between input filter 20 and photocathode 50 of image intensifier 22 may be used to protect photocathode 50 from contamination.

Although an embodiment of the invention and its advantages are described in detail, a person skilled in the art could make various alterations, additions, and omissions without departing from the spirit and scope of the present invention as defined by the appended claims.

What is claimed is:

1. A multi-hue intensified image generator comprising:

an input filter for receiving photons and filtering received photons, said input filter comprising sections for filtering photons of a predetermined hue;

an image intensifier for receiving filtered photons from said input filter, said image intensifier multiplying said photons;

an output obscurant directing photons from said image intensifier;

an output filter for receiving filtered and intensified photons from said image intensifier, said output filter comprising sections for filtering photons of a predetermined hue, said sections movable using a displacement device; and a multi-hue display device for displaying a multi-hue intensified image comprising a display that displays an image perceived as having multiple hues when said input filter and said output filter are moved at a sufficient frequency.

2. The multi-hue intensified image generator of claim 1 wherein said input filter sections are movable using a displacement device.

3. The multi-hue intensified image generator of claim 1 further comprising:

an input lens comprising sections directing photons onto said input filter sections.

4. The multi-hue intensified image generator of claim 1 wherein said display device comprises:

a phosphor screen for receiving photons from said output filter.

5. The multi-hue intensified image generator of claim 4 wherein said output filter corrects for the spectral characteristics of said phosphor screen.

6. The multi-hue intensified image generator of claim 1 wherein said output filter comprises features for tint control.

7. The multi-hue intensified image generator of claim 1 wherein said image intensifier comprises:

a microchannel plate.

8. The multi-hue intensified image generator of claim 2 wherein said input filter and said output filter are moved approximately 60 times per second.

9. The multi-hue intensified image generator of claim 1 wherein said input filter comprises a sensing array.

10. A method of generating an intensified multi-hue image comprising:

providing a first filter for receiving photons, said first filter comprising sections for filtering received photons of predetermined hues;

providing an image intensifier for receiving filtered photons from said first filter;

providing an output obscurant directing photons from said image intensifier;

providing a second filter for receiving filtered and intensified photons from said image intensifier, said second filter comprising sections for filtering received photons of predetermined hues;

providing an output device for receiving photons from said second filter and generating a displayed image using said received photons; and moving said first filter and said second filter using at least one displacement device, said first filter and said second filter being moved at a frame rate that generates a displayed image on said phosphor screen perceived as having multiple colors.

11. The method of claim 10 wherein said moving occurs approximately 60 times per second.

12. The method of claim 10 wherein said providing a first filter comprises providing a first filter comprising a sensing array.

13. The method of claim 10 wherein said second filter corrects for the spectral characteristics of said phosphor screen.

14. The method of claim 10 wherein said second filter controls tint.

15. The method of claim 10 further comprising:

providing at least one input lens for directing photons through said first filter.

16. The method of claim 10 wherein said output device is selected from the group consisting of:

database, monitor, printer, lens, phosphor screen, and any combination thereof.

17. A multi-hue image intensifier comprising:

means for input filtering received photons;

means for intensifying receiving photons from said means from input filtering, said means comprising a microchannel array;

means for output filtering, said means operable to receive photons from said means for intensifying, said means further comprising an output obscurant directing photons from said means for intensifying;

means for receiving output, said means operable to receive photons from said means for output filtering;

means for moving said input filtering means and said output filtering means.

18. The multi-hue image intensifier of claim 17 further wherein said means for receiving output displays an image.

19. The multi-hue image intensifier of claim 18 wherein said means for moving is operable to move said input filtering means and said output filtering means at a rate sufficient to generate an image on said means for receiving output that is perceived as having multiple hues.

20. The multi-hue image intensifier of claim 17 wherein said means for output filtering corrects for the spectral characteristics of said means for receiving output.

21. The multi-hue image intensifier of claim 17 wherein said means for output filtering comprises means for tint control.

* * * * *